(12) United States Patent
Yamauchi et al.

(10) Patent No.: US 10,637,437 B2
(45) Date of Patent: Apr. 28, 2020

(54) AT-CUT CRYSTAL ELEMENT AND CRYSTAL RESONATOR

(71) Applicant: NIHON DEMPA KOGYO CO., LTD., Tokyo (JP)

(72) Inventors: Hiroyuki Yamauchi, Saitama (JP); Kazuhiko Osawa, Saitama (JP); Shohei Takeda, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 299 days.

(21) Appl. No.: 15/559,831

(22) PCT Filed: Mar. 17, 2016

(86) PCT No.: PCT/JP2016/058474
§ 371 (c)(1),
(2) Date: Sep. 20, 2017

(87) PCT Pub. No.: WO2016/167073
PCT Pub. Date: Oct. 20, 2016

(65) Prior Publication Data
US 2018/0062614 A1    Mar. 1, 2018

(30) Foreign Application Priority Data

Apr. 15, 2015 (JP) .................. 2015-082946

(51) Int. Cl.
*H03H 9/13* (2006.01)
*H03H 9/19* (2006.01)
(Continued)

(52) U.S. Cl.
CPC ........... *H03H 9/132* (2013.01); *H01L 41/332* (2013.01); *H03H 3/02* (2013.01);
(Continued)

(58) Field of Classification Search
CPC combination set(s) only.
See application file for complete search history.

(56) References Cited

U.S. PATENT DOCUMENTS 8,084,926 B2 * 12/2011 Naito ................. H03H 3/04
                                                        310/348
2012/0056514 A1    3/2012 Ishikawa et al.
(Continued)

FOREIGN PATENT DOCUMENTS

CN    102386871    3/2012
CN    103490742    1/2014
(Continued)

OTHER PUBLICATIONS

"International Search Report (Form PCT/ISA/210) of PCT/JP2016/058474", dated Jun. 7, 2016, with English translation thereof, pp. 1-2.
(Continued)

*Primary Examiner* — Bryan P Gordon
(74) *Attorney, Agent, or Firm* — JCIPRNET (57) ABSTRACT

An AT-cut crystal element is provided for reducing unnecessary vibration and for improving impedance of a resonator. Two side surfaces intersecting with a Z'-axis of a crystallographic axis of crystal are constituted of three surfaces of a first surface as an m-surface of quartz crystal, a second surface that intersects with the first surface and is other than the m-surface, and a third surface that intersects with the second surface and is other than the m-surface. Moreover, the second surface is a surface corresponding to a surface obtained by rotating a principal surface of the AT-cut crystal element by $-74\pm3°$ having an X-axis of crystal as a rotation axis, and the third surface is a surface
(Continued)

corresponding to a surface obtained by rotating the principal surface by −56±3° having the X-axis of the crystal as the rotation axis.

9 Claims, 11 Drawing Sheets

(51) Int. Cl.
*H03H 9/10* (2006.01)
*H03H 9/02* (2006.01)
*H03H 3/02* (2006.01)
*H01L 41/332* (2013.01)
*H03H 3/04* (2006.01)

(52) U.S. Cl.
CPC .......... *H03H 9/02023* (2013.01); *H03H 9/10* (2013.01); *H03H 9/1021* (2013.01); *H03H 9/19* (2013.01); *H03H 2003/022* (2013.01); *H03H 2003/0435* (2013.01)

(56) References Cited

U.S. PATENT DOCUMENTS

| | | | |
|---|---|---|---|
| 2012/0126668 A1* | 5/2012 | Il | H03H 3/02 310/357 |
| 2013/0328449 A1 | 12/2013 | Takahashi et al. | |
| 2016/0294356 A1* | 10/2016 | Kuwahara | H03H 9/19 |
| 2017/0070206 A1* | 3/2017 | Sato | H03H 3/02 |
| 2017/0187349 A1* | 6/2017 | Sato | H03H 9/19 |

FOREIGN PATENT DOCUMENTS

| | | |
|---|---|---|
| JP | 2008-067345 | 3/2008 |
| JP | 2011-193292 | 9/2011 |
| JP | 2014-027506 | 2/2014 |
| JP | 2014-230056 | 12/2014 |

OTHER PUBLICATIONS

Office Action of China Counterpart Application, with English translation thereof, dated on Dec. 25, 2019, pp. 1-10.

* cited by examiner

AT-CUT CRYSTAL ELEMENT AND CRYSTAL RESONATOR

CROSS-REFERENCE TO RELATED APPLICATION

This application is a 371 application of the international PCT application serial no. PCT/JP2016/058474, filed on Mar. 17, 2016, which claims the priority benefits of Japan application no. 2015-082946, filed on Apr. 15, 2015. The entirety of each of the abovementioned patent applications is hereby incorporated by reference herein and made a part of this specification.

TECHNICAL FIELD

The present invention relates to an AT-cut crystal element and a crystal resonator using the same.

BACKGROUND ART

As downsizing of an AT-cut crystal resonator proceeds, it has become difficult to fabricate crystal elements for crystal resonators by a fabrication method of mechanical processing. Then, an AT-cut crystal element fabricated using photolithography technique and wet etching technique has been developed.

A known AT-cut crystal element and crystal resonator fabricated by the above-described techniques is disclosed in, for example, Patent Documents 1 and 2. Specifically, Patent Document 1 discloses an AT-cut crystal element in which a side surface (Z'-surface) intersecting with a Z'-axis of crystal is constituted of two surfaces of an m-surface of a quartz crystal and a crystal surface other than the m-surface, and a crystal resonator that employs the AT-cut crystal element. Patent Document 2 discloses an AT-cut crystal element in which a side surface intersecting with a Z'-axis of the crystal (Z'-surface) is constituted of at least four surfaces, and a crystal resonator that employs the AT-cut crystal element.

In each case of Patent Documents 1 and 2, an etching resist mask for forming an outer shape is formed on a quartz substrate, and a part on the quartz substrate without being covered with the mask is dissolved by the wet etching. Specifically, in the case of Patent Document 1, the wet etching is performed to the quartz substrate such that two surfaces including the m-surface are formed on the corresponding side surface. In the case of Patent Document 2, an etching of forming the outer shape is firstly performed to the quartz substrate on which the etching resist mask is formed. Then, the etching resist mask is removed to expose the quartz substrate, and subsequently, the wet etching is performed to the quartz substrate such that at least four surfaces are formed on the corresponding side surface. In each case of Patent Documents 1 and 2, the etching resist mask is formed to be used on the quartz substrate while being displaced on the front and back of the quartz substrate in a Z'-direction by a predetermined amount (a mask-displacement amount $\Delta z$). The mask-displacement amount $\Delta z$ is appropriately $\Delta z=0.75 \times T \pm 20\%$ when a thickness of the AT-cut quartz substrate is indicated as T (μm). Each crystal element formed in such process is reduced vibration leakage to achieve an AT-cut crystal resonator with excellent property.

CITATION LIST

Patent Document
Patent Document 1: Japanese Unexamined Patent Application Publication No. 2008-67345
Patent Document 2: Japanese Unexamined Patent Application Publication No. 2014-27506

SUMMARY

Problems to be Solved

However, the inventor of the present application earnestly studied to find that the AT-cut crystal resonator still had room for improving the property.

This application is made in view of the above-described situation, and the object of this application is to provide a novel AT-cut crystal element and a crystal resonator configured to improve the property compared with a conventional AT-cut crystal element and a crystal resonator.

Solutions to the Problems

To achieve the above-described object, an AT-cut crystal element according the invention includes side surfaces that intersect with a Z'-axis of a crystallographic axis of crystal, and at least one side surface of the side surfaces is constituted of three surfaces of a first surface as an m-surface of a quartz crystal, a second surface that intersects with the first surface and is other than the m-surface, and a third surface that intersects with the second surface and is other than the m-surface.

In carrying out the present invention, preferably, the second surface is a surface corresponding to a surface obtained by rotating an X-Z'-surface (this surface is referred to as a principal surface in this Description) of the AT-cut crystal element indicated by a crystallographic axis of the crystal by $-74\pm5°$ having an X-axis of the crystal as a rotation axis, and the third surface is a surface corresponding to a surface obtained by rotating the principal surface by $-56\pm5°$ having the X-axis of the crystal as the rotation axis. More preferably, the second surface is a surface corresponding to a surface obtained by rotating the principal surface by $-74\pm3$ having the X-axis of the crystal as the rotation axis, and the third surface is a surface corresponding to a surface obtained by rotating the principal surface by $-56\pm3°$ having the X-axis of the crystal as the rotation axis. Here, minus of $-74$ and $-56$ means that the principal surface is rotated clockwise having the X-axis as the rotation axis (the same applies to the following).

Furthermore, in carrying out the present invention, preferably, two side surfaces intersecting with a Z'-axis of the crystallographic axis of the crystal of the AT-cut crystal element are each constituted of the above three surfaces of the first surface to third surface. More preferably, the two side surfaces are in a relation of point symmetry having a center point of the AT-cut crystal element as a center (FIG. 1B).

A crystal resonator of the invention includes the above-described AT-cut crystal element according to the invention, an excitation electrode for exciting the crystal element. More specifically, the crystal resonator includes the excitation electrodes on respective principal surfaces (above X-Z'-surfaces) of front and back of the crystal element, and extraction electrodes extracted from the excitation electrodes. Obviously, a crystal unit configured to further include a container that houses the crystal resonator with the electrodes is included in the crystal resonator described in the present invention.

The AT-cut crystal element described in the present invention includes the above-described crystal element according to the invention and a crystal element (hereinafter referred to as a framed crystal element) that includes a framing portion integrally formed with the crystal element to surround the entire or a part of the crystal element across a through portion, and one or two or more connecting portions similarly integrally formed to connect the crystal element to the framing portion FIGS. 11A and 11B. The crystal resonator described in the present invention includes the crystal resonator including the above-described framed crystal element, the excitation electrode, and the extraction electrode, and includes the crystal unit further including the container that houses the crystal resonator.

In manufacturing the AT-cut crystal element of the invention, a method including processes of the following (a) and (b) is preferred to be employed.

(a) A process where etching resist masks are formed on expected parts, on which the crystal element is to be formed, of the front and back of the AT-cut quartz-crystal wafer, and etching is performed on parts exposed from the mask by a hydrofluoric acid-based etchant. Note that, the etching resist masks on the front and back are displaced to one another by $\Delta z$ in a Z'-axis direction of the crystal. A mask-displacement amount $\Delta z$ is configured to be a value selected in a range of $T1 \leq \Delta z \leq 1.5 \cdot T1$ when a thickness of the quartz-crystal wafer is T1. That is, the mask-displacement amount $\Delta z$ is configured to be a value selected in a range of T1 to $1.5 \cdot T1$. Etching period is configured to be a period selected in a range of 70% to 125% of a period enough for etching from one surface of the quartz-crystal wafer by the thickness T1 of the quartz-crystal wafer.

(b) A process where, after the process of above-described (a), second etching resist masks are left on only the first region as vibrating regions of the crystal element in the part of the quartz-crystal wafer covered with the etching resist masks, or the second etching resist masks are newly formed, and the etching is performed on parts exposed from the second etching resist masks by a predetermined thickness h, thus forming the second region disposed continuous with the first region and having a second thickness T2 thinner than the thickness of the first region. According to the preferred method, the AT-cut crystal element according to the invention having side surfaces constituted of the three surfaces of the first to the third surfaces can be easily obtained.

Effects of the Invention

According to the AT-cut crystal element of the invention, the Z'-side surface constituted of predetermined three surfaces achieves the crystal element that has a unique beak shaped structure portion on the end portion in the Z'-direction of the crystal element in a sectional view. Therefore, the above-described unique structure portion reduces unnecessary vibration other than vibration originated from the AT-cut, thus the vibration originated from the AT-cut crystal resonator can be dominantly generated. Accordingly, the AT-cut crystal resonator whose property is improved compared with a conventional AT-cut crystal resonator can be achieved.

DESCRIPTION OF EMBODIMENTS

The following describes the embodiments of an AT-cut crystal element and a crystal resonator that employs the AT-cut crystal element according to the present invention with reference to drawings. Each drawing used in descriptions are merely illustrated schematically for understanding the embodiments. In each drawing used in descriptions, like reference numerals designate corresponding or identical elements, and therefore such elements will not be further elaborated here. Shapes, dimensions, material, and similar factor described in the following explanations are merely preferable examples within the embodiments. Therefore, the disclosure is not limited to only the following embodiments.

1. Structure of AT-Cut Crystal Element

Figure 1A:
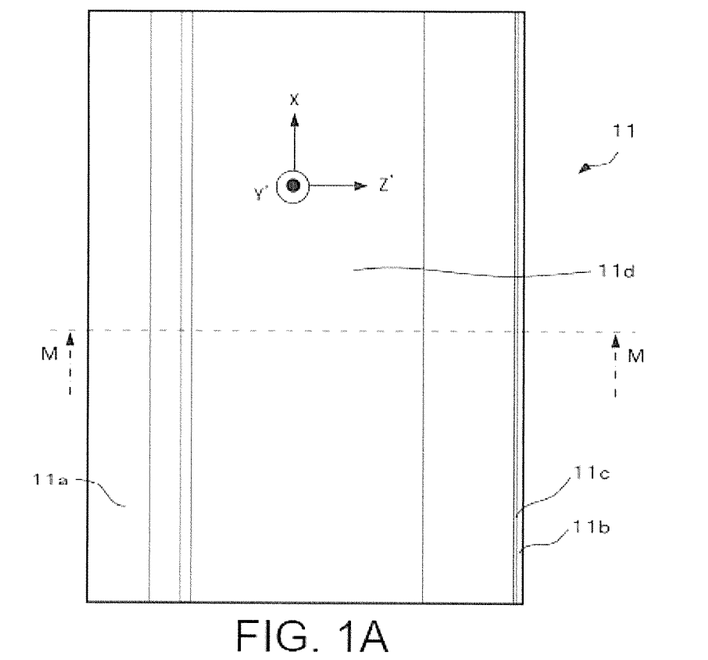
FIGS. 1A, 1B and 1C are explanatory drawings illustrating an AT-cut crystal element 11 according to an embodiment.
Figure 1B:
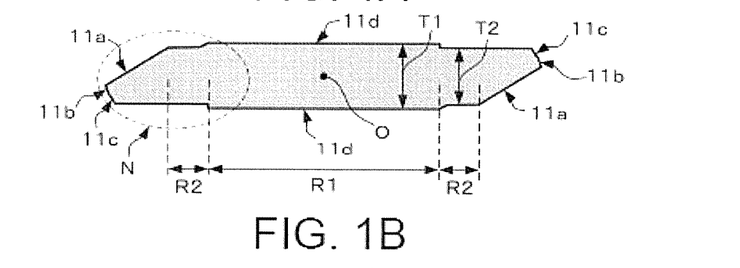
Figure 1C:
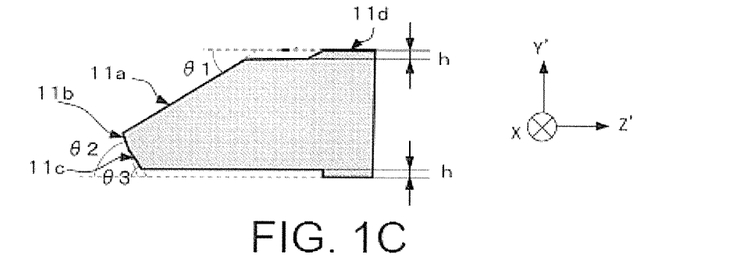

FIG. 1A to FIG. 1C are explanatory drawings illustrating an AT-cut crystal element 11 according to the embodiment. Especially, FIG. 1(A) FIG. 1A is a plan view of the crystal element 11, FIG. 1(B) FIG. 1B is a sectional drawing of the crystal element 11 taken along a line M-M in FIG. 1(A) FIG. 1A, and FIG. 1(C) FIG. 1C is an enlarged sectional drawing illustrating a part N in FIG. 1(B) FIG. 1B.

Here, coordinate axes X, Y', and Z' illustrated in FIG. 1A and FIG. 1C are crystallographic axes of crystal in the AT-cut crystal element. The AT-cut crystal element is described in, for example, "Handbook of Quartz Crystal Device" (Fourth Edition, page 7 or other pages, published by Quartz Crystal Industry Association of Japan, March 2002) in detail. Therefore, the explanation will be omitted.

The AT-cut crystal element 11 according to the present invention has a property in a shape of a side surface (Z'-surface) intersecting with the Z'-axis of the crystal. That is, especially illustrated in FIG. 1B and FIG. 1C, the AT-cut crystal element 11 has two side surfaces (Z'-surfaces) intersecting with the Z'-axis of the crystal, and each Z'-surface is configured of three surfaces of a first surface 11a, a second surface 11b, and a third surface 11c. Moreover, the first surface 11a is an m-surface of a quartz crystal. The second surface 11b is a surface that intersects with the first surface 11a and is formed of a surface other than the m-surface, specifically, the second surface 11b is a surface corresponding to a surface where a principal surface 11d of the crystal element 11 is rotated around the X-axis of the crystal by θ2. The third surface 11c is a surface that intersects with the second surface 11b and is formed of a surface other than the m-surface, specifically, the third surface 11c is a surface corresponding to a surface where the principal surface 11d of the crystal element 11 is rotated around the X-axis of the crystal by θ3. The first surface 11a intersects with the principal surface 11d. Since the first surface 11a is the m-surface, the first surface 11a corresponds to a surface having a relation of θ1 with the principal surface 11d. The θ1 is an angle decided corresponding to a design of the AT-cut crystal element, and is the proximity of 36° (typically, approximately 35° 15'±1°).

The above angles θ2 and θ3 preferably have the values below according to experiments by the inventor, while the details will be described later in "3. Experimental Result." θ2=−74°±5°, θ3=−56°±5°, more preferably, θ2=−74°±3°, θ3=−56°±3°

The crystal element 11 according to the embodiment is configured such that the two side surfaces (Z'-surfaces) intersecting with the Z'-axis of the crystal are disposed in a point symmetry with a center point O of the crystal element 11 (see FIG. 1B) as a center. Here, the point symmetry includes a state of the point symmetry that can be regarded as a substantially identical shape even if there is a slight difference in the shape.

The crystal element 11 according to the embodiment is configured to have a planar shape in a rectangular shape, where a direction along the X-axis of the crystal is a long side, and a direction along the Z'-axis of the crystal is a short side.

The crystal element 11 according to the embodiment is configured to have a first region R1 and a second region R2. The first region R1 is a region constituting a vibrating region of the crystal element 11 and is a region having a thickness T1. The second region R2 is disposed continuously with the first region R1 on the outside of the first region R1, and is a region having a second thickness T2 that is thinner than the thickness of the first region R1. The first region R1 and the second region R2 are continuously disposed having a thickness difference h. Dimensions of the thickness difference h are configured to be a value that can effectively confine vibration energy in the first region R1. Specifically, the thickness difference h is a value selected from a range of 3% to 20% with respect to the T1, typically, a few μm.

2. Exemplary Manufacturing Method for AT-Cut Crystal Element 11

Next, a description will be given of an exemplary manufacturing method for the AT-cut crystal element 11 according to the embodiment with reference to FIG. 2A to FIG. 7E. A large number of the crystal element 11 can be manufactured from a quartz-crystal wafer by photolithography technique and wet etching technique. Accordingly, FIG. 2A to FIG. 7E include plan views of a quartz-crystal wafer 11w and enlarged plan views of a part P of the quartz-crystal wafer 11w. Further, some drawings among FIG. 2A to FIG. 7E also include sectional drawings taken along a line Q-Q of the part P of the quartz-crystal wafer 11w, and enlarged figures of a part R (see FIG. 5B).

Figure 2A:
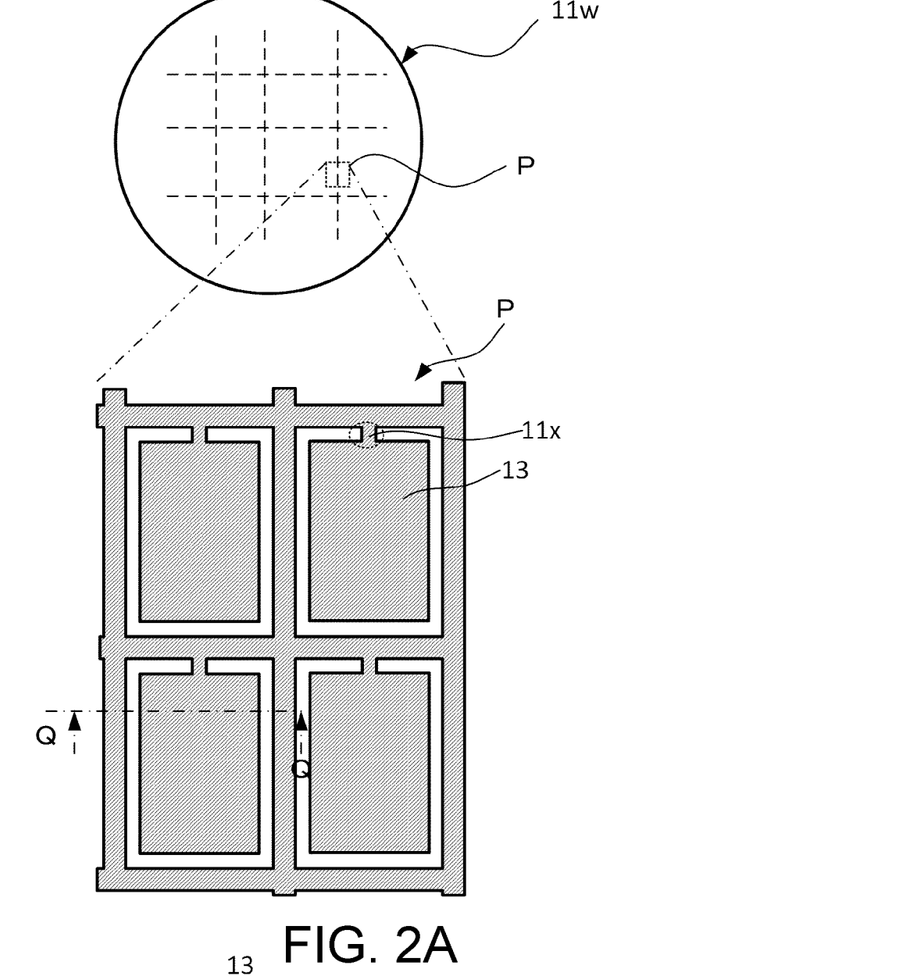
FIGS. 2A and 2B are drawings illustrating an exemplary manufacturing method for a crystal element 11 and a crystal resonator that employs the crystal element 11 according to the embodiment.
Figure 2B:
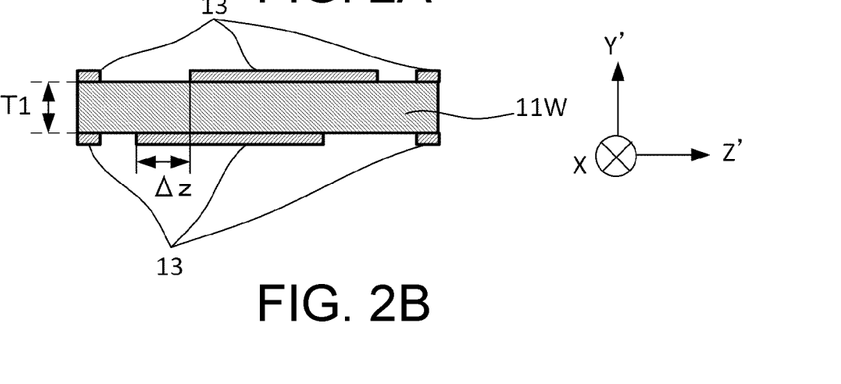

In the exemplary manufacturing method, first, the quartz-crystal wafer 11w is prepared (FIGS. 2A and 2B). As it is well known, the oscillation frequency of the AT-cut crystal element 11 is approximately determined by the thickness of the principal surface (X-Z' surface) of the crystal element 11. The quartz-crystal wafer 11w in this case is a wafer having thickness T1 as the first thickness (FIG. 2B).

Next, the well-known photolithography technique is used to form etching resist masks 13, which is a mask to form the outer shape of the crystal element, on both front and back surfaces of the quartz-crystal wafer 11w. The etching resist masks 13 according to the embodiment are configured of a part corresponding to the outer shape of the crystal element, a frame part that holds each crystal element, and a connecting part that connects the crystal element and the frame part (a part indicated as a 11x in FIG. 2A). Moreover, parts of the etching resist masks 13 constituting the crystal element 11 are formed in shapes where the masks on the front and back are displaced to one another along the Z'-axis by a predetermined amount Δz (see FIG. 2B). Specifically, the front and back masks are relatively displaced such that the etching resist mask disposed on a +Y-surface side of the crystal element is displaced by Δz in a +Z'-direction with respect to the etching resist mask disposed on a −Y'-surface side. This mask-displacement amount Δz is configured to be an appropriate value corresponding to the property of the crystal resonator provided in a range of T1≤Δz≤1.5·T1 with respect to the thickness T1 of the quartz-crystal wafer 11w. The details of an etching period in forming the outer shape and the mask-displacement amount Δz will be described later in "3. Experimental Result."

Figure 3A:
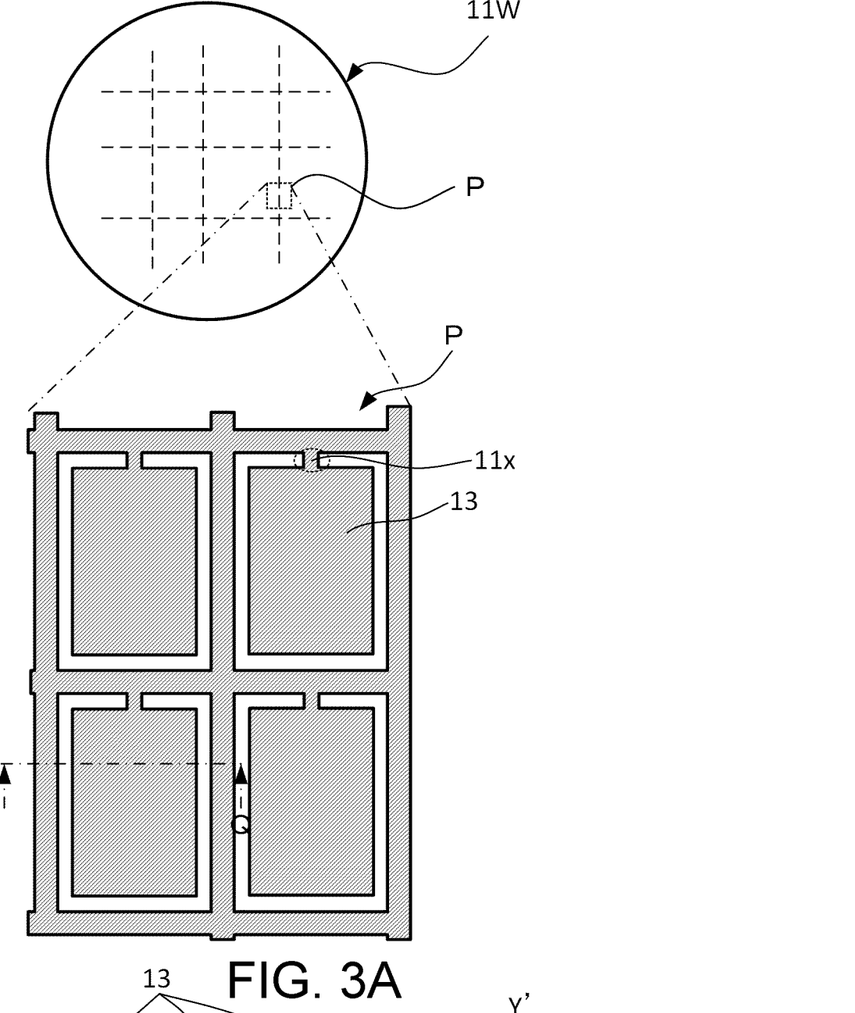
FIGS. 3A and 3B are explanatory drawings illustrating the exemplary manufacturing method following FIGS. 2A and 2B.
Figure 3B:
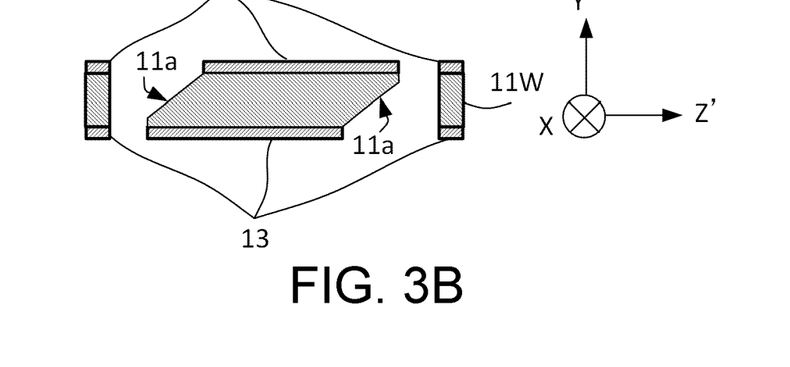

The quartz-crystal wafer 11w after forming of the etching resist masks 13 is dipped in an etching solution mainly composed of hydrogen fluoride for a predetermined period. This process dissolves parts of the quartz-crystal wafer 11w without being covered with the etching resist masks 13 to provide the approximate outer shape of the crystal element 11. In this wet etching, the etching in the Z-axis direction of the quartz crystal proceeds dominantly, thus the first surface 11a corresponding to the in-surface of the quartz crystal appears (FIG. 3B).

Figure 4A:
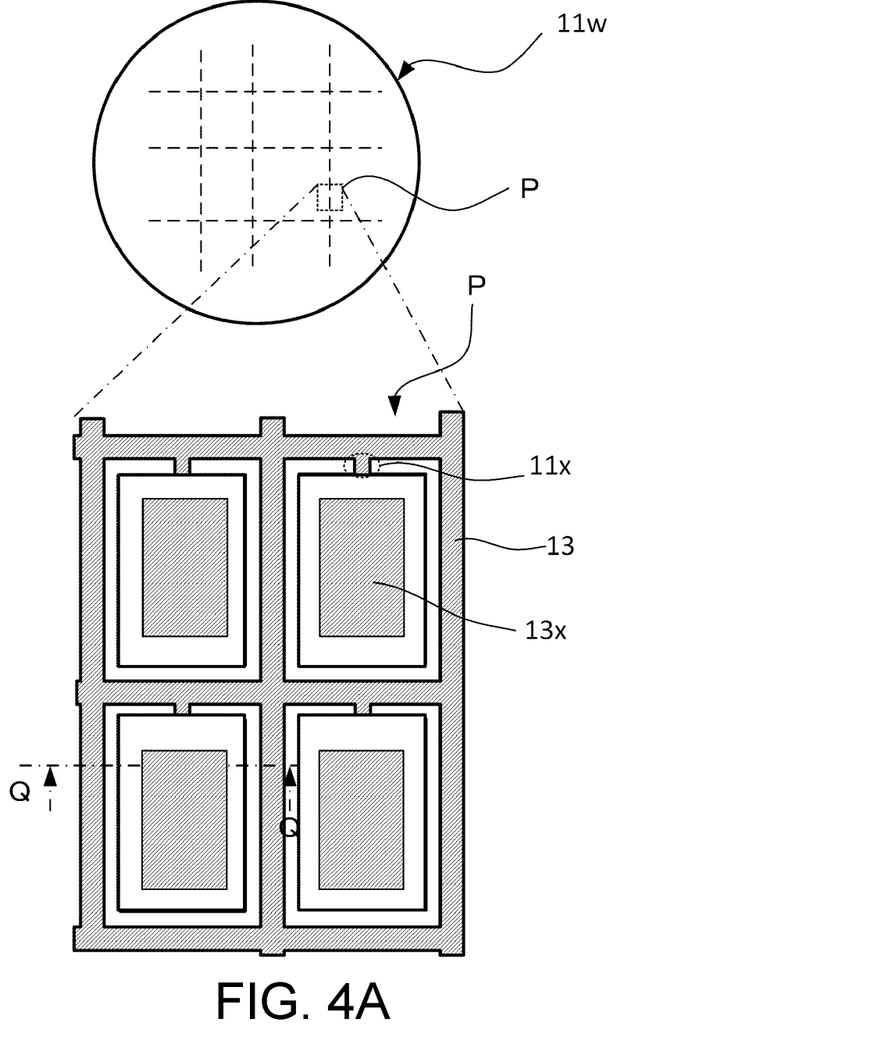
FIGS. 4A and 4B are explanatory drawings illustrating the exemplary manufacturing method following FIGS. 3A and 3B.
Figure 4B:
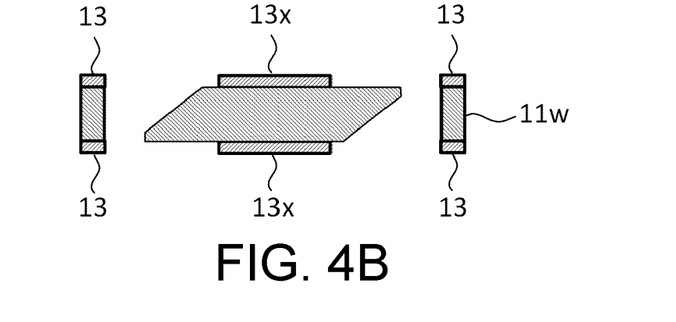

Next, for forming the first region and the second region on the crystal element 11, the well-known photolithography technique is used to form second etching resist masks 13x on an expected region, on which the first region is to be formed, of a part of the crystal element 11 of the quartz-crystal wafer 11w (FIGS. 4A and 4B). The second etching resist mask 13x can be obtained by, for example, a method where, in forming the etching resist mask 13, the photoresist is left (not illustrated) on the expected region for forming the second etching resist mask on this etching resist mask 13, so as to selectively remove the etching resist mask 13 by using the photoresist as the mask, or a method to form a new second etching resist mask.

Next, the quartz-crystal wafer 11w after forming of the second etching resist masks 13x is dipped again in the etching solution mainly composed of hydrogen fluoride for a predetermined period. Here, the predetermined period is a period where, as illustrated in especially FIG. 1B and FIG. 5C, the etching is performed on the part of the quartz-crystal wafer 11w exposed from the second etching resist mask 13x, so as to generate the above-described first region R1 and the second region R2 continuous with this first region R1 with the thickness difference h on the crystal element 11.

Figure 5A:
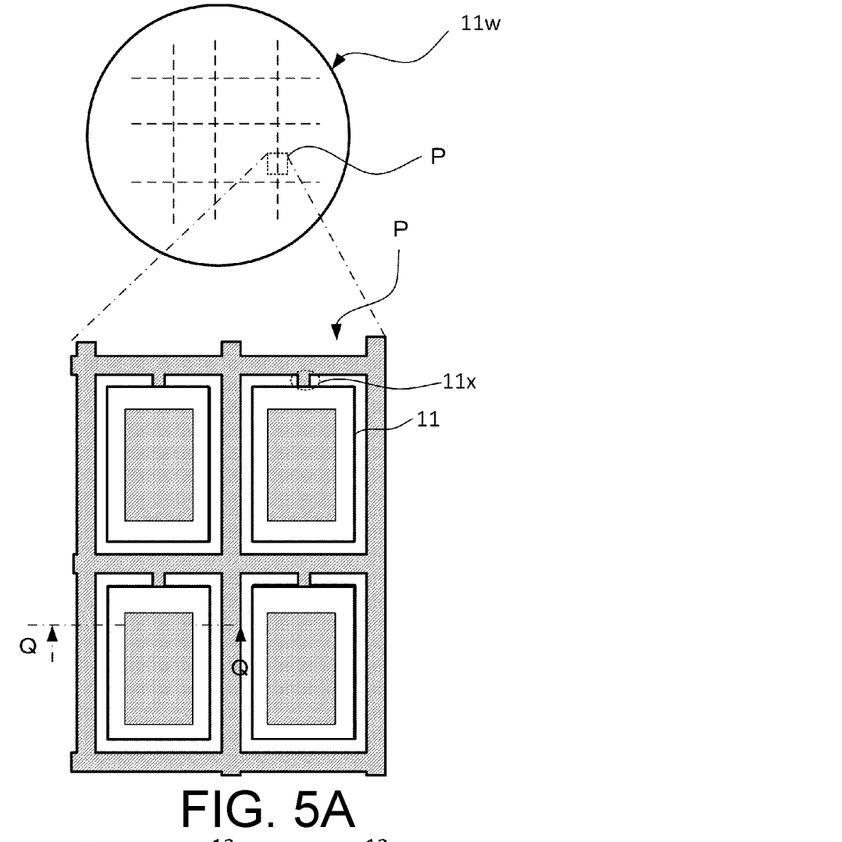
FIGS. 5A, 5B and 5C are explanatory drawings illustrating the exemplary manufacturing method following FIGS. 4A and 4B.
Figure 5B:
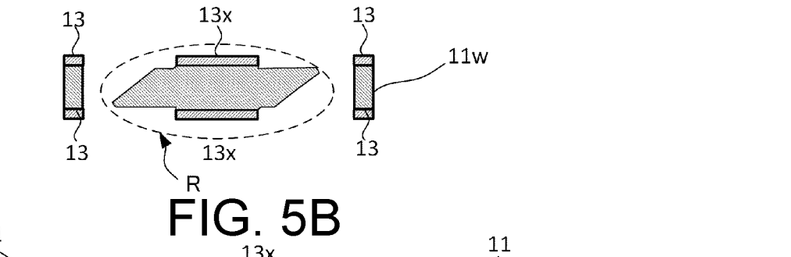
Figure 5C:
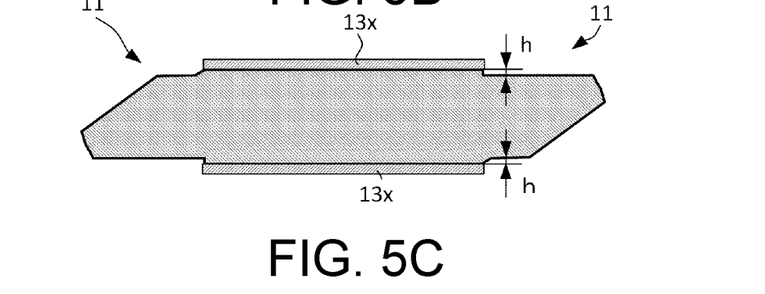
Figure 6:
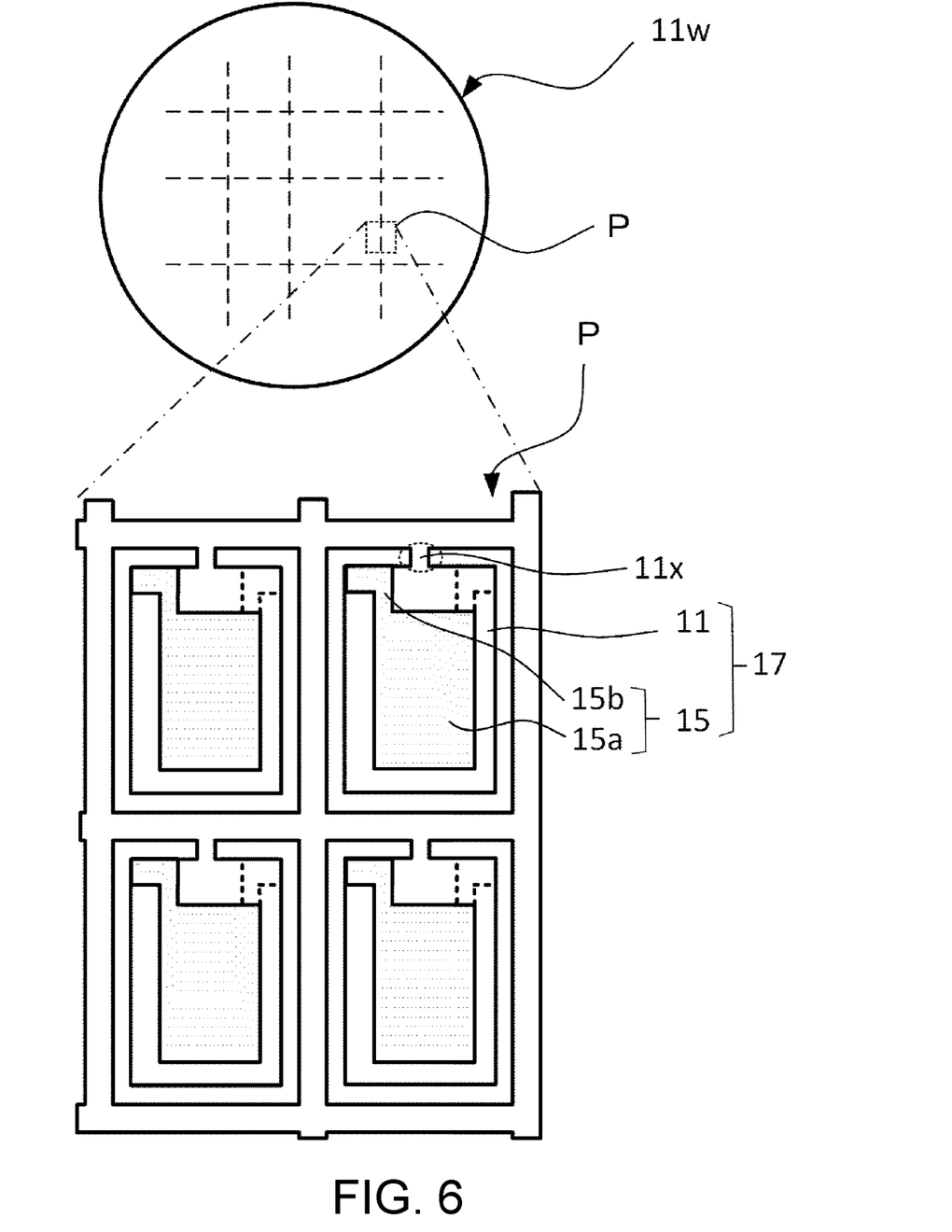
FIG. 6 is an explanatory drawing illustrating the exemplary manufacturing method following FIGS. 5A, 5B and 5C.

By the above-described process, the quartz-crystal wafer that includes a large number of the AT-cut crystal elements 11 according to the invention is obtained with a configuration where the Z'-side surface of the crystal element 11 is constituted of the predetermined first to third surfaces 11a, 11b, and 11c (FIGS. 5A to 5C). Subsequently, the etching resist masks 13 and 13x are removed from the quartz-crystal wafer to expose a crystal surface (not illustrated). Then, a well-known film formation method is used to form a metal film (not illustrated) for forming excitation electrodes and extraction electrodes of the crystal resonator on the entire surface of the quartz-crystal wafer. Next, the well-known photolithography technique and metal etching technique are used to perform a patterning on the metal film in an electrode shape to form an electrode 15 constituted of an excitation electrode 15a and an extraction electrode 15b. This provides a crystal resonator 17 that includes the crystal element 11, the excitation electrode 15a and the extraction electrode 15b (FIG. 6). The excitation electrode 15a is disposed on the whole region of the first region R1 of the crystal element 11 or a part of the region of the first region R1 corresponding to the design.

Generally, a structure in which the crystal resonator 17 is mounted in a preferred container is often referred to as a crystal unit. The following describes the typical example with reference to FIGS. 7A to 7E. FIGS. 7A to 7E include plan views and sectional drawings taken along a line S-S illustrating a procedure to mount the crystal resonator 17 in a container 21.

Figure 7A:
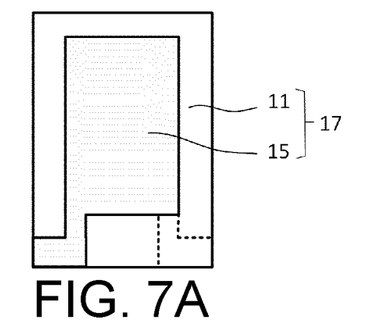
FIGS. 7A, 7B, 7C, 7D and 7E are explanatory drawings illustrating an exemplary crystal resonator on which the crystal element 11 is mounted to be manufactured.
Figure 7B:
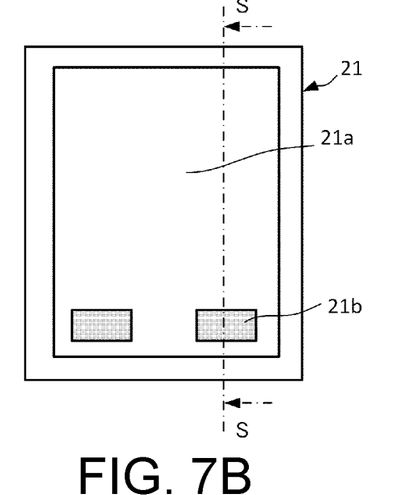
Figure 7C:
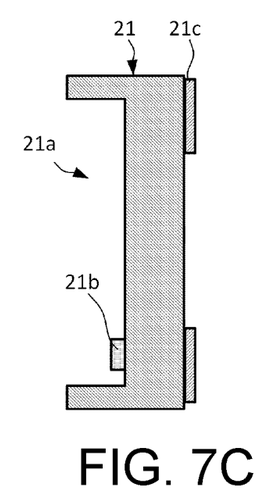
Figure 7D:
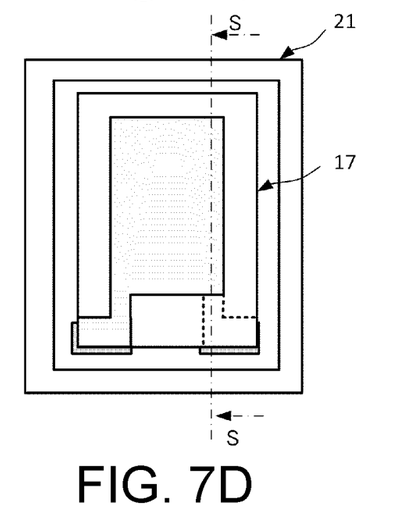
Figure 7E:
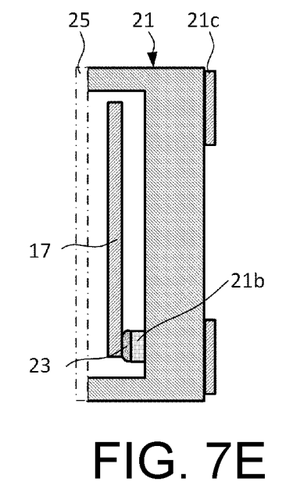

In a state illustrated in FIG. 6, the crystal resonator 17 is connected to the quartz-crystal wafer 11w via a connecting portion 11x. Therefore, at first, an appropriate external force is applied to the connecting portion 11x to separate the crystal resonator 17 from the quartz-crystal wafer 11w and individually dice the crystal resonator 17 (FIG. 7A). On the other hand, as a container, for example, a well-known ceramic package 21 is prepared. In this case, the ceramic package 21 includes a depressed portion 21a, a bump 21b, and a mounting terminal 21c. The depressed portion 21a (FIGS. 7B and 7C) houses the crystal resonator 17. The bump 21b is disposed on the bottom face of the depressed portion 21a to secure the crystal resonator. The mounting terminal 21c is disposed on the back surface of the package 21. The bump 21b is electrically connected to the mounting terminal 21c by a via wiring (not illustrated).

The crystal resonator 17 is mounted in the depressed portion 21a of the package 21. In detail, an adhesive material 23 (FIG. 7E) is applied over the bump 21b to fix the crystal resonator 17 on the bump 21b at the position of the extraction electrode 15b. Then, a well-known method is used to adjust the oscillation frequency of the crystal element 11 to a predetermined value. Next, after the inside of the depressed portion 21a of the package 21 is made in an appropriate vacuum atmosphere, an inert gas atmosphere, or similar atmosphere, a well-known method is used to seal the depressed portion 21a with a lid 25. This provides the crystal unit with a structure where the crystal resonator is housed in the package 21.

3. Experimental Result

Next, experimental results will be described with reference to FIGS. 8A to 8D, FIGS. 9A to 9B and FIGS. 10A to 10D. Here, the experimental results with the crystal resonator having the oscillation frequency of 38.4 MHz are mainly described. A part of the experimental results includes the experimental results with the crystal resonator having the oscillation frequency of 48 MHz.

3-1. Mask-Displacement Amount Δz and Shape of Z'-Surface of Crystal Element

First, a description will be given of the influence of the mask-displacement amount Δz on the shape of the Z'-surface of the crystal element 11. Here, the experimental results with the crystal resonator having the oscillation frequency of 38.4 MHz are described. Accordingly, in this case, the thickness T1 of the first region R1 is approximately 40.4

Figure 8A:
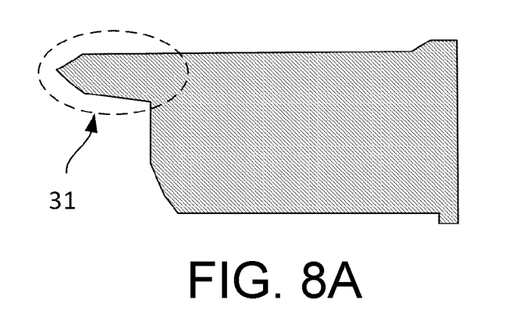
FIGS. 8A, 8B, 8C and 8D are explanatory drawings illustrating experimental results according to the present invention.
Figure 8B:
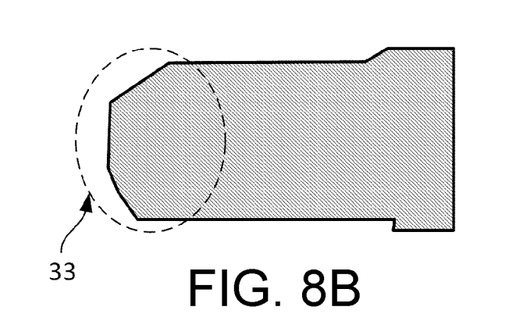
Figure 8C:
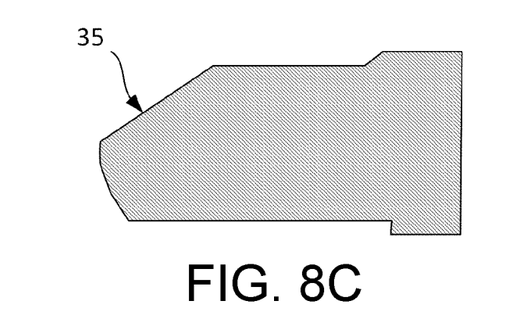
Figure 8D:
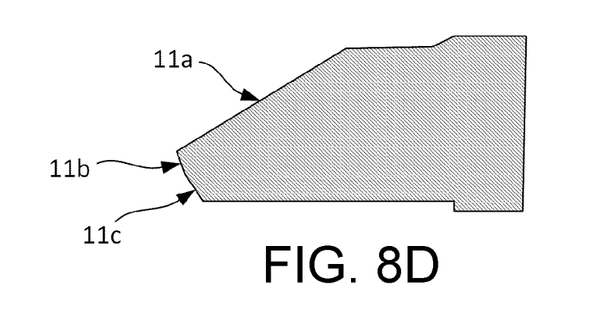

FIGS. 8A to 8D are sectional drawings corresponding to a part N illustrated in FIG. 1B of each experimental sample (crystal resonator) experimentally produced in a state where the mask-displacement amounts Δz are different with the above-described manufacturing method and the following etching conditions. Specifically, FIG. 8A is a sectional drawing of a sample formed in the case of the mask-displacement amount Δz=0, FIG. 8B is a sectional drawing of a sample formed in the case of the mask-displacement amount Δz=27 μm, FIG. 8(C) FIG. 8C is a sectional drawing of a sample formed in the case of the mask-displacement amount Δz=39 μm, and FIG. 8D is a sectional drawing of a sample formed in the case of the mask-displacement amount Δz=51 μm.

The ratios obtained by normalizing each of the mask-displacement amounts Δz=27 μm, 39 μm, and 51 μm of the samples by the thickness T1 (in this example, 40.4 μm) of the first region R1 of the quartz-crystal wafer are 27/40.4≠66.8%, 39/40.4≠96.5%, and 51/40.4≠126.2%.

The quartz-crystal wafers having thus set mask-displacement amounts Δz are dipped in the hydrofluoric acid-based etchant for a period for performing the etching from one surface of the quartz-crystal wafer by the thickness T1 of the quartz-crystal wafer. In the embodiment, since the etching is performed from both surfaces of the quartz-crystal wafer, in principle, the quartz-crystal wafer can be passed through when the etching period is a period enough for etching a half of the thickness T1 of the quartz-crystal wafer from one surface of the quartz-crystal wafer. However, for preventing etching residue due to side etching or similar failure, the embodiment employs a period twice of the etching period, that is, a period for etching a plate thickness T1. Therefore, in this Description and FIG. 9A, an outer shape etching amount is defined as follows. That is, as described above, in the case of the outer shape etching amount enough for performing the etching by the thickness T1 of the quartz-crystal wafer from one surface of the quartz-crystal wafer, the outer shape etching amount=T1/T1=100%. Similarly, for example, the outer shape etching amount enough for performing the etching by 75% from one surface of the quartz-crystal wafer with the thickness T1 is indicated as 0.75T1/T1=75%, and similarly, the outer shape etching amount enough for performing the etching by 125% is indicated as 1.25T1/T1=125%. Then, the inventor has performed the experiments to find that the outer shape etching amount for obtaining the AT-cut crystal element of the invention is preferably a value selected from a range of 70% to 125% from the aspect of preventing the etching residue or similar failure. Next, the above-described method is used for performing the etching so as to obtain the second region R2.

The comparison of the sectional drawings of each sample, on which the etching is performed as described above, illustrated in FIGS. 8A to 8D indicate the following.

In the case of the mask-displacement amount Δz=0, as illustrated in FIG. 8A, the Z'-surface of the crystal element has a shape on a part of which a remarkable protrusion 31 is left. In the case of the mask-displacement amount Δz=27 μm, as illustrated in FIG. 8B, the Z'-surface has a shape including a multifaceted (four or more surfaces) structure 33 convex in the Z'-direction. In the case of the mask-displacement amount Δz=39 μm, as illustrated in FIG. 8C, the Z'-surface has a shape including a four-surface structure with an m-surface 35 of the quartz crystal. In the case of the mask-displacement amount Δz=51 μm, as illustrated in FIG. 8D, the Z'-surface has a shape according to the invention including three surfaces of the first to third surfaces 11a to 11c.

Figure 9A:
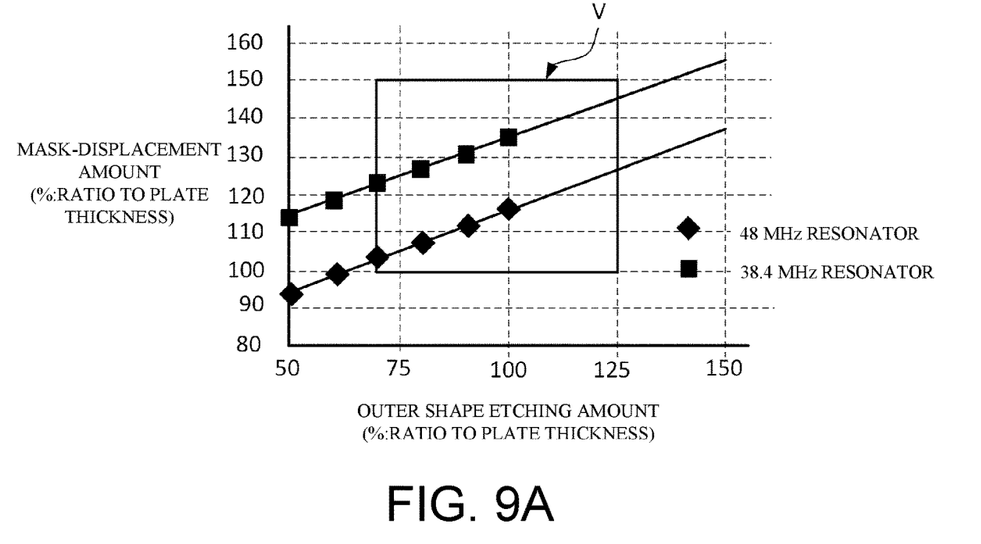
FIGS. 9A and 9B are explanatory drawings illustrating the experimental results according to the present invention following FIGS. 8A, 8B, 8C and 8D.

FIG. 9A is an explanatory drawing illustrating the relation between the mask-displacement amount Δz and the outer shape etching amount where the crystal element constituted of the three surfaces of the first to the third surfaces according to the invention is obtained. In FIG. 9A, the horizontal axis is the outer shape etching amount, and the vertical axis is the mask-displacement amount. Both the mask-displacement amount of the vertical axis and the outer shape etching amount of the horizontal axis are indicated, as described above, as the ratio to the thickness T1 (μm) of the first region of the crystal element. FIG. 9A indicates the experimental results with two kinds of the crystal resonators having the oscillation frequencies of 38.4 MHz and 48 MHz.

Conditions on an approximate straight line and conditions on the proximity of the approximate straight line in FIG. 9A are conditions where the crystal element of the invention having the Z'-side surface constituted of the first to the third surfaces is obtained. Therefore, FIG. 9A indicates that it is appropriate to provide the outer shape etching amount in a range of 70% to 125% and the mask-displacement amount in a range of 100% to 150% (a range of square indicated by V in FIG. 9A).

3-2. Shape of Z'-Surface of Crystal Element and Property of Crystal Resonator

Next, a description will be given of the relations between the respective samples (crystal resonators) having the Z'-surfaces of the crystal elements with the shapes described with reference to FIGS. 8A to 8D and the properties of the samples, specifically, crystal impedance (CI) at ordinary temperature with reference to FIG. 9B and FIGS. 10A to 10D.

Figure 9B:
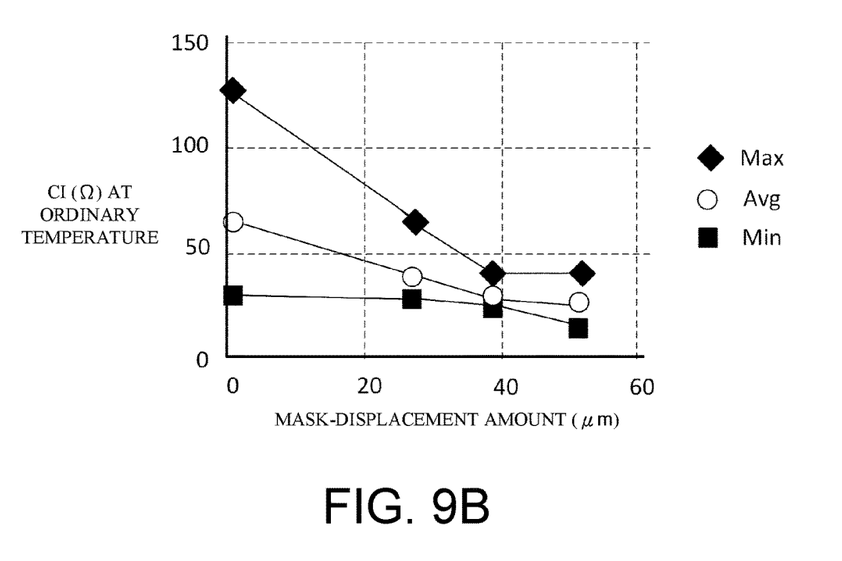
Figure 10A:
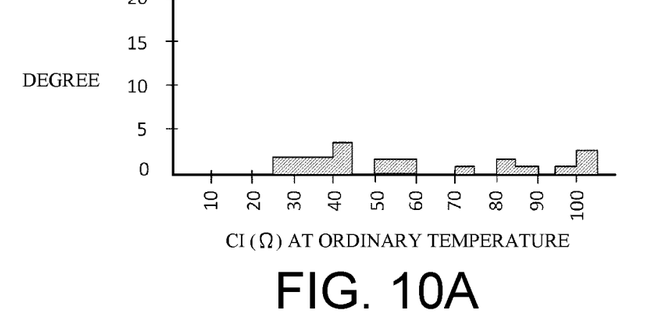
FIGS. 10A, 10B, 10C and 10D are explanatory drawings illustrating the experimental results according to the present invention following FIGS. 9A and 9B.
Figure 10B:
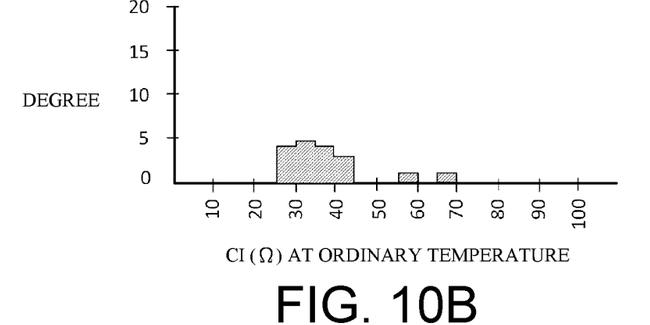
Figure 10C:
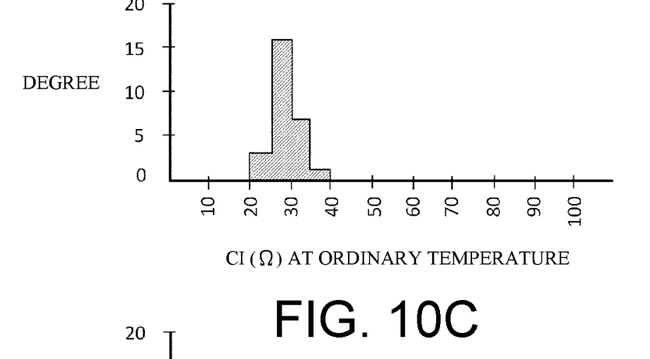
Figure 10D:
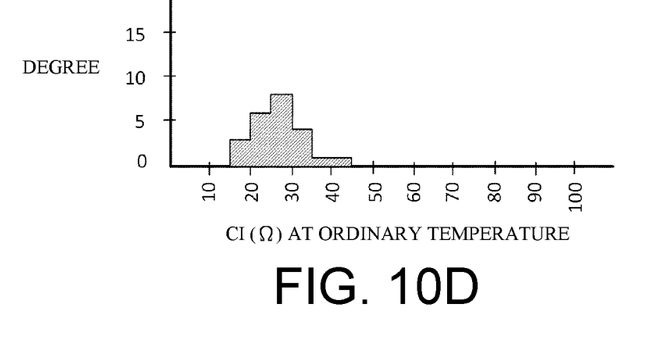

First, FIG. 10A is a CI distribution of the crystal resonator of the mask-displacement amount=0, FIG. 10B is a CI distribution of the crystal resonator of the mask-displacement amount=27 μm, FIG. 10C is a CI distribution of the crystal resonator of the mask-displacement amount=39 μm, and FIG. 10D is a CI distribution of the crystal resonator of the mask-displacement amount=51 μm. The respective samples have the experimental results performed with use of the crystal resonators having the container size of 1.6×1.2 mm. FIG. 9B is a characteristic diagram that indicates the average value (Avg), the maximum value (Max), and the minimum value (Min) of the CI of a group of the four kinds of the crystal resonators.

As known from FIG. 9B and FIGS. 10A to 10D, in the case of the crystal resonator of the invention where the Z'-surface of the crystal element is constituted of three surfaces in total of the m-surface and two crystal surfaces different from the m-surface, it is found that the CI value can be improved to approximately half of the comparative examples of FIGS. 8A and 8B. While the average value is equivalent to the comparative example indicated in FIG. 8C, it is found that the average value of the CI value can be decreased to near 15Ω, thus improved by approximately 5Ω compared with the comparative example.

4. Other Embodiments

While the embodiment of the AT-cut crystal element and the crystal resonator that employs the AT-cut crystal element according to this disclosure is described above, this disclosure is not limited to the above-described embodiment. For example, in the above-described embodiment, while the configuration where the side surfaces of both ends in the Z' direction are constituted of the three surfaces of the first to the third surfaces according to the embodiment is described, in other embodiments, only one side surface may be constituted of the three surfaces of the first to the third surfaces. However, the configuration where both the side surfaces are constituted of the three surfaces of the first to the third surface provides the crystal resonator with more excellent property. While in the above-described embodiment, the crystal resonators with the frequencies of 38.4 MHz and 48 MHz are employed, this disclosure is applicable to the crystal resonator with the other frequency.

Figure 11A:
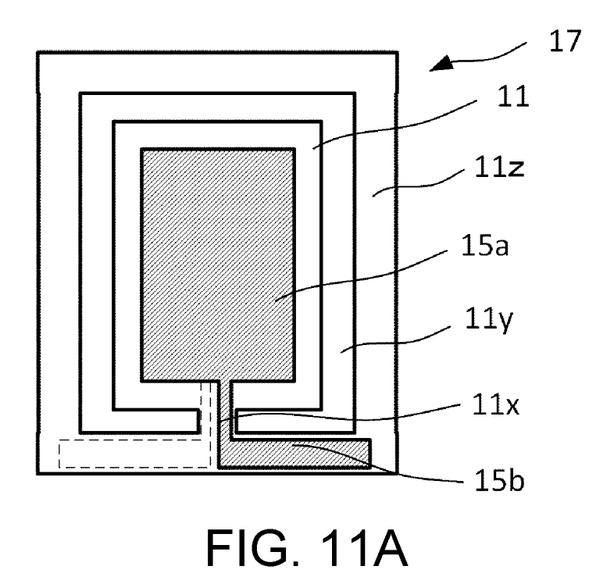
FIGS. 11A and 11B are explanatory drawings illustrating another embodiment of the crystal resonator according to the present invention.
Figure 11B:
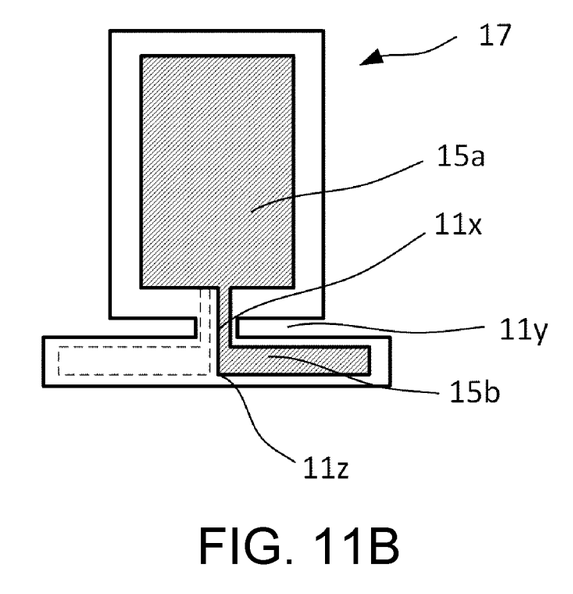

The AT-cut crystal element and the crystal resonator according to the invention may have the structure illustrated in FIGS. 11A and 11B. Firstly, as illustrated in FIG. 11A, the crystal element and the crystal resonator include the crystal element 11 according to the invention, a framing portion 11z, and one connecting portion 11x. The framing portion 11z is integrally formed with the crystal element 11 and boxes the crystal element 11 with the entire framing portion 11z separated by a through portion 11y. The connecting portion 11x is also integrally formed with the crystal element 11, and connects the crystal element 11 to the framing portion 11z. As illustrated in FIG. 11B, the crystal element and the crystal resonator include the crystal element 11 according to the disclosure, the framing portion 11z, and one connecting portion 11x. The framing portion 11z is integrally formed with the crystal element 11 and boxes the crystal element 11 with a part of the framing portion 11z separated by the through portion 11y. The connecting portion 11x is also integrally formed with the crystal element 11, and connects the crystal element 11 to the framing portion 11z. The connecting portion may be disposed two or more. However, the configuration of one connecting portion reduces vibration leakage from the crystal element 11 to the framing portion and the influence of the stress from the framing portion to the crystal element more easily. The position where the connecting portion 11x is disposed is not limited to the example in FIGS. 11A and 11B. The position may be changed corresponding to the design.

While in the above-described embodiment, the crystal element that has a side along the X-axis of the crystal as a long side, and a side along the Z'-axis as a short side is employed, the present invention is applicable to a crystal element that has a side along the X-axis of the crystal as a short side, and a side along the Z'-axis as a long side. While in the above-described embodiment, the crystal element that has a planar shape in a rectangular shape, the present invention is applicable to a crystal element that has corner portions to which an R processing or a C processing is performed. While an example where the second region is disposed only in the Z'-direction of the crystal element 11 is described, the second region may be disposed in the X-direction.

The invention claimed is:

1. An AT-cut crystal element, comprising:
    side surfaces that intersect with a Z'-axis of a crystallographic axis of crystal,
    at least one side surface of the side surfaces being constituted of three surfaces of a first surface, a second surface, and a third surface, wherein
        the first surface being an m-surface of a quartz crystal,
        the second surface intersecting with the first surface and being other than the m-surface,
        the third surface intersecting with the second surface and being other than the m-surface.

2. The AT-cut crystal element according to claim 1, wherein
    the second surface is a surface corresponding to a surface obtained by rotating an X-Z'-surface which is a principle surface of the AT-cut crystal element indicated by a crystallographic axis of the crystal by −74±5° having an X-axis of the crystal as a rotation axis, and the third surface is a surface corresponding to a surface obtained by rotating the principal surface by −56±5° having the X-axis of the crystal as the rotation axis.

3. The AT-cut crystal element according to claim 1, wherein
the second surface is a surface corresponding to a surface obtained by rotating an X-Z'-surface which is a principle surface of the AT-cut crystal element indicated by a crystallographic axis of the crystal by −74±3° having an X-axis of the crystal as a rotation axis, and
the third surface is a surface corresponding to a surface obtained by rotating the principal surface by −56±3° having the X-axis of the crystal as the rotation axis.

4. The AT-cut crystal element according to claim 1, wherein
the AT-cut crystal element has a planar shape in a rectangular shape, and has one side along the Z'-axis.

5. The AT-cut crystal element according to claim 1, wherein
each of both side surfaces is constituted of three surfaces of the first surface to the third surface.

6. The AT-cut crystal element according to claim 1, wherein
the both side surfaces are in a relation of point symmetry one another having a center point of the AT-cut crystal element as a center.

7. The AT-cut crystal element according to claim 1, wherein
the AT-cut crystal element is a crystal element that includes a first region and a second region,
the first region has a first thickness, and
the second region has a second thickness thinner than the first thickness and is formed continuous with the first region on an outside of the first region.

8. A crystal resonator, comprising:
the crystal element according to claim 1;
an excitation electrode, disposed on front and back of the crystal element; and
an extraction electrode, extracted from the excitation electrode.

9. A crystal unit, comprising:
the crystal resonator according to claim 8; and
a container, housing the crystal resonator.

* * * * *